(12) United States Patent
Thomsen et al.

(10) Patent No.: US 9,866,238 B1
(45) Date of Patent: Jan. 9, 2018

(54) INCREMENTAL ANALOG TO DIGITAL CONVERTER WITH EFFICIENT RESIDUE CONVERSION

(71) Applicant: SILICON LABORATORIES INC., Austin, TX (US)

(72) Inventors: Axel Thomsen, Austin, TX (US); Xiaodong Wang, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/499,540

(22) Filed: Apr. 27, 2017

(51) Int. Cl.
  *H03M 1/12* (2006.01)
  *H03M 3/00* (2006.01)

(52) U.S. Cl.
  CPC .......... *H03M 3/462* (2013.01); *H03M 3/422* (2013.01); *H03M 3/466* (2013.01)

(58) Field of Classification Search
  CPC ....... H03M 3/462; H03M 3/422; H03M 3/466
  USPC .................................................. 341/143, 155
  See application file for complete search history.

(56) References Cited

U.S. PATENT DOCUMENTS

| | | | |
|---|---|---|---|
| 8,466,821 B2* | 6/2013 | Morita ..................... | H03M 3/47 341/143 |
| 8,471,744 B1* | 6/2013 | Wan ........................ | H03M 3/34 341/143 |
| 8,576,104 B2* | 11/2013 | Steensgaard-Madsen ............. | H03M 1/0682 341/155 |
| 8,624,767 B2* | 1/2014 | Schmid ................. | H03M 3/338 341/143 |

OTHER PUBLICATIONS

Temes, Gabor C. et al. "Incremental Data Converters" Proceedings of the 19th International Symposium on Mathematical Theory of Networks and Systems. MTNS Jul. 5-9, 2010. Budapest, Hungary. pp. 715-721.
Baker, Bonnie "How Delta-Sigma ADCs Work, Part 1" Analog Applications Journal, 3Q, 2011 High-Performance Analog Products. Texas Instruments Incorporated. pp. 13-16.

(Continued)

*Primary Examiner* — Brian Young
(74) *Attorney, Agent, or Firm* — Gary Stanford; Huffman Law Group, PC

(57) ABSTRACT

An incremental analog to digital converter for digitizing an analog voltage including an $M^{th}$ order delta sigma modulator, an $M^{th}$ order digital decimation filter, a controller, and a digital combiner. The controller operates the modulator to convert the analog voltage into multiple digital samples, and operates the digital decimation filter to convert the digital samples into a preliminary digital output value. The controller further operates the delta sigma modulator during a residue phase for M clock cycles in which the modulator provides a digital residue value. The digital combiner combines the preliminary digital output value with the digital residue value to provide an initial digital output value. For an $M^{th}$ order system, only M additional cycles are needed to extract the residual value to increase the resolution of the digital output by an amount based on the resolution of a modulator quantizer.

20 Claims, 4 Drawing Sheets

(56) References Cited

OTHER PUBLICATIONS

Baker, Bonnie "How Delta-Sigma ADCs Work, Part 2" Analog Applications Journal, 4Q, 2011 High-Performance Analog Products. Texas Instruments Incorporated. pp. 5-7.
Chen, Chia-Hung et al. "A Micro-Power Two-Step Incremental Analog-to-Digital Converter" IEEE Journal of Solid-State Circuits, vol. 50, No. 8, Aug. 2015. pp. 1796-1808.
Clifford, Michael "Fundamental Principles Behind the Sigma-Delta ADS Topology: Part 1" Technical Article for Analog Devices, Inc. pp. 1-4 May 19, 2016.

* cited by examiner

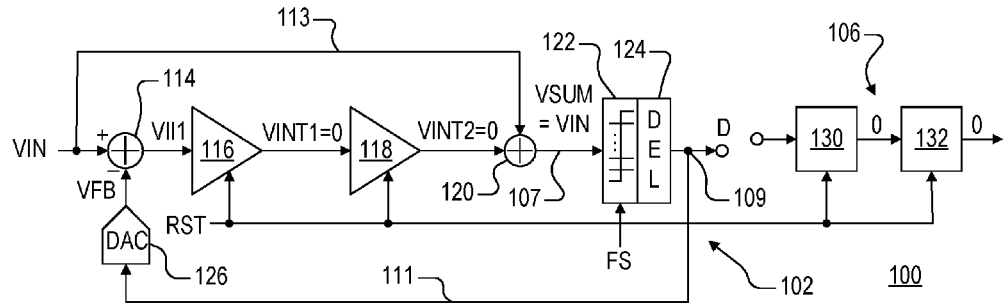
*FIG. 3 (RESET PHASE)*
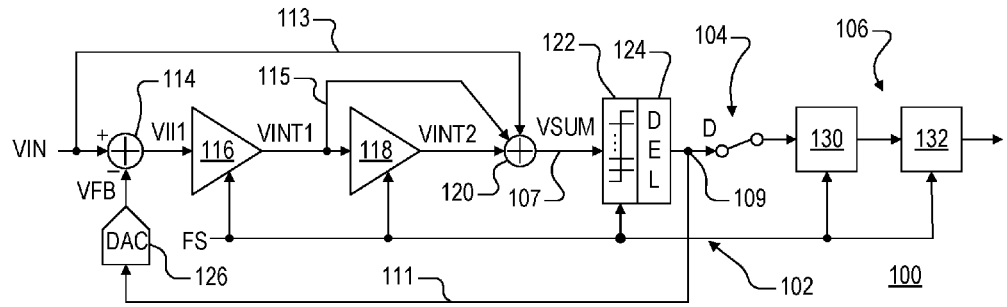
*FIG. 4*
*(DELTA SIGMA PHASE & FIRST CYCLE OF RESIDUE PHASE)*
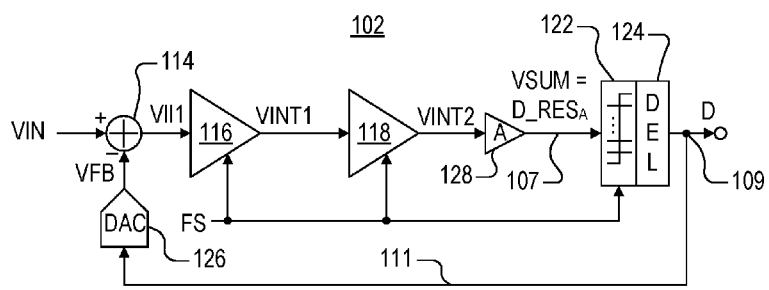
*FIG. 5 (LAST CYCLE OF RESIDUE PHASE)*

*(OUTPUT PHASE)*

| CNUM | VINT1/k1 | VINT2 | D(-1) |
|---|---|---|---|
| 0 (RST) | 0 | 0 | D_0 |
| 1 | VIN[1]-D0 | 0 | D_1 |
| 2 | VIN[1]+VIN[2] − (D0+D1) | VINT2[1]+k2*VINT1[1] = k2*VINT1[1] | D_2 |
| 3 | VIN[1]+VIN[2] + VIN[3] − (D0+D1+D2) | VINT2[2]+k2*VINT1[2] = k2*VINT1[1]+k2*VINT1[2] | D_3 |
| ... | ... | ... | ... |
| N+1 | $\sum_{i=1}^{n+1}(VIN[i] - D_{i-1})$ | $k1*k2*\sum_{i=1}^{n}\sum_{i=1}^{l}(VIN[i] - D_{i-1})$ | D_RES |

↑ 802    ↑ 804    800    ↑ 806    ↑ 808

INCREMENTAL ANALOG TO DIGITAL CONVERTER WITH EFFICIENT RESIDUE CONVERSION

BACKGROUND OF THE INVENTION

Field of the Invention

The present invention relates in general to analog to digital converters, and more particularly to an incremental analog to digital converter (IADC) with efficient residue conversion.

Description of the Related Art

An incremental analog to digital converter (IADC) is useful in multiple channel sensor applications for converting sensed analog signals to digital values. Typical sensor applications include image sensors, weight scale, digital voltmeter, wearable devices for acquiring temperature, magnetic, pressure, and bio-potential information, etc. Sensor applications often involve narrow-band signals with frequencies from DC (direct current) up to several hundred Hertz (Hz) in the presence of DC offset voltage and flicker noise. In addition, in certain applications the IADC may be multiplexed among many channels, even up to hundreds of channels for sensing hundreds of corresponding signals.

The IADC may be integrated in a system-on-chip (SoC) or the like and may be employed within a battery powered system. Thus, the IADC should be highly efficient in terms of power consumption and circuit area and should also have a relatively high resolution to achieve high accuracy for sensor applications, including sensor applications with narrow-band signals that may include DC offset voltage and flicker noise.

SUMMARY OF THE INVENTION

An incremental analog to digital converter for digitizing an analog voltage according to one embodiment includes a delta sigma modulator, a digital decimation filter, a controller, and a digital combiner. The delta sigma modulator receives the analog voltage and includes M analog integrators in which M is at least one. The digital decimation filter includes M digital integrators and has an input selectively coupled to an output of the delta sigma modulator. For each of at least one conversion cycle, the controller resets the delta sigma modulator and the digital decimation filter during a reset stage, operates the delta sigma modulator and the digital decimation filter for multiple clock cycles during a delta sigma phase in which the delta sigma modulator converts the analog voltage into multiple digital samples, and in which the digital decimation filter converts the digital samples into a preliminary digital output value. The controller further operates the delta sigma modulator during a residue phase for M clock cycles in which delta sigma modulator provides a digital residue value. The digital combiner combines the preliminary digital output value with the digital residue value to provide an initial digital output value.

The digital combiner may include a digital multiplier and a digital adder. The digital multiplier multiplies the preliminary digital output value by a gain value to provide a multiplied value, and the digital adder adds the digital residue value to the multiplied value to provide the initial digital output value. The digital multiplier may be implemented as a shift register configuration or the like. A digital multiplier may be provided that multiplies the initial digital output value by a gain value based on N and M to provide a final digital output value having a full-scale value that is an exact power of 2, in which N is a total number of clock cycles of the reset stage and the delta sigma phase.

The digital decimation filter may include at least one digital integrator that digitally integrates the digital samples to develop an accumulated value, and a digital decimator that decimates the accumulated value by N+M to provide the preliminary digital output value in which N is a total number of clock cycles of the reset stage and the delta sigma phase.

The delta sigma modulator may include analog adders, analog integrators, a quantizer and a feedback quantizer to convert the analog voltage to the digital samples. The controller resets the analog integrators during the reset phase, and controls electronic switches to couple the analog voltage and the outputs of the analog integrators to an analog adder during the reset phase, the delta sigma phase and a first clock cycle of the residue phase, and to decouple the analog voltage and the outputs of the analog integrators from the analog adder during a last clock cycle of the residue phase. The controller may further control the switches to replace the second analog adder with an analog amplifier during the last clock cycle of the residue phase. The controller may further controls the electronic switches to couple the output of the delta sigma modulator to the input of the digital decimation filter during the delta sigma phase and during the first clock cycle of the residue phase, and to couple the output of the delta sigma modulator to an input of the digital combiner during an output phase immediately following the residue phase.

The digital decimation filter may include a first digital integrator, a second digital integrator, and a decimator. The first digital integrator has an input that is coupled to the output of the delta sigma modulator during the sigma delta phase and for a first clock cycle of the residue phase, and the second digital integrator has an input coupled to an output of the first digital integrator. The decimator has an input coupled to an output of the second digital integrator and has an output providing the preliminary digital output value. The decimator decimates an output of the second digital integrator by N+M to provide the preliminary digital output value, in which N is a total number of clock cycles of the reset stage and the delta sigma phase, and M is a total number of clock cycles of the residue phase. A digital multiplier may be included that multiplies the initial digital output value by a gain value based on N and M to provide a final digital output value having a full-scale value based on a power of 2.

A method of digitizing an analog voltage according to one embodiment includes resetting integrators of an Mth order delta sigma modulator and an Mth order digital decimation filter during a reset phase, in which M is at least one, operating the delta sigma modulator for multiple clock cycles during a delta sigma phase for converting the analog voltage into digital samples, operating the digital decimation filter during the delta sigma phase to convert the digital samples into a preliminary digital output value, operating the delta sigma modulator during a residue phase for an additional M clock cycles for providing a digital residue value, and digitally combining the preliminary digital output value with the digital residue value during an output phase to provide an initial digital output value.

The method may include multiplying the preliminary digital output value by a gain value to provide a multiplied value, and adding the digital residue value to the multiplied value to provide the initial digital output value. The method may include operating the delta sigma modulator for N clock cycles and multiplying the initial digital output value by a gain value based on N and M to provide a final digital output value having a full-scale value that is an exact power of 2. The method may include digitally integrating N digital samples to provide an accumulated value, and decimating the accumulated value by N+M to provide the preliminary digital output value. The method may include digitally integrating the N digital samples to provide first accumulated values and digitally integrating the first accumulated values to provide a second accumulated value.

Operating the delta sigma modulator for clock cycles during the delta sigma phase and for a first clock cycle of the residue phase may include subtracting a feedback voltage from the analog voltage to provide a difference value, integrating the difference value to provide a first integrated value, integrating the first integrated value to provide a second integrated value, adding together the analog voltage, the first integrated value, and the second integrated value to provide a sum value, quantizing the sum value to provide a corresponding digital sample, and converting each corresponding digital sample into the feedback voltage. For a last clock cycle of the residue phase, operating the delta sigma modulator may include integrating the difference value to provide the first integrated value, integrating the first integrated value to provide the second integrated value, amplifying the second integrated value to provide an amplified value, and quantizing the amplified value to provide the digital residue value. The method may include shifting the preliminary digital output value to provide a multiplied value, adding the digital residue value to the multiplied value to provide the initial digital output value, and multiplying the initial digital output value by a gain value based on N and M to provide a final digital output value having a full-scale value based on a power of 2.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a block diagram of the configuration of the IADC of FIG. 1 during the reset phase;

FIG. 4 is a block diagram of the configuration of the IADC of FIG. 1 during the delta sigma phase and the first cycle of the residue phase;

FIG. 5 is a block diagram of the configuration of the ΔΣ modulator 102 of FIG. 1 during the last FS cycle of the residue phase;

DETAILED DESCRIPTION

The inventors have recognized the need for an energy and area efficient analog to digital converter (ADC) for various applications including battery-powered multi-channel sensoring applications. They have therefore developed an incremental ADC (IADC) with an innovative cascading residue conversion system and method to increase the ADC resolution without significant circuit overhead other than a digital adder. The residue conversion described herein only increases the conversion time by a small number of cycles compared to other IADC methods for retrieving residue, and therefore maintains ADC conversion speed without increasing energy per conversion by more than a minimal amount.

Figure 1:
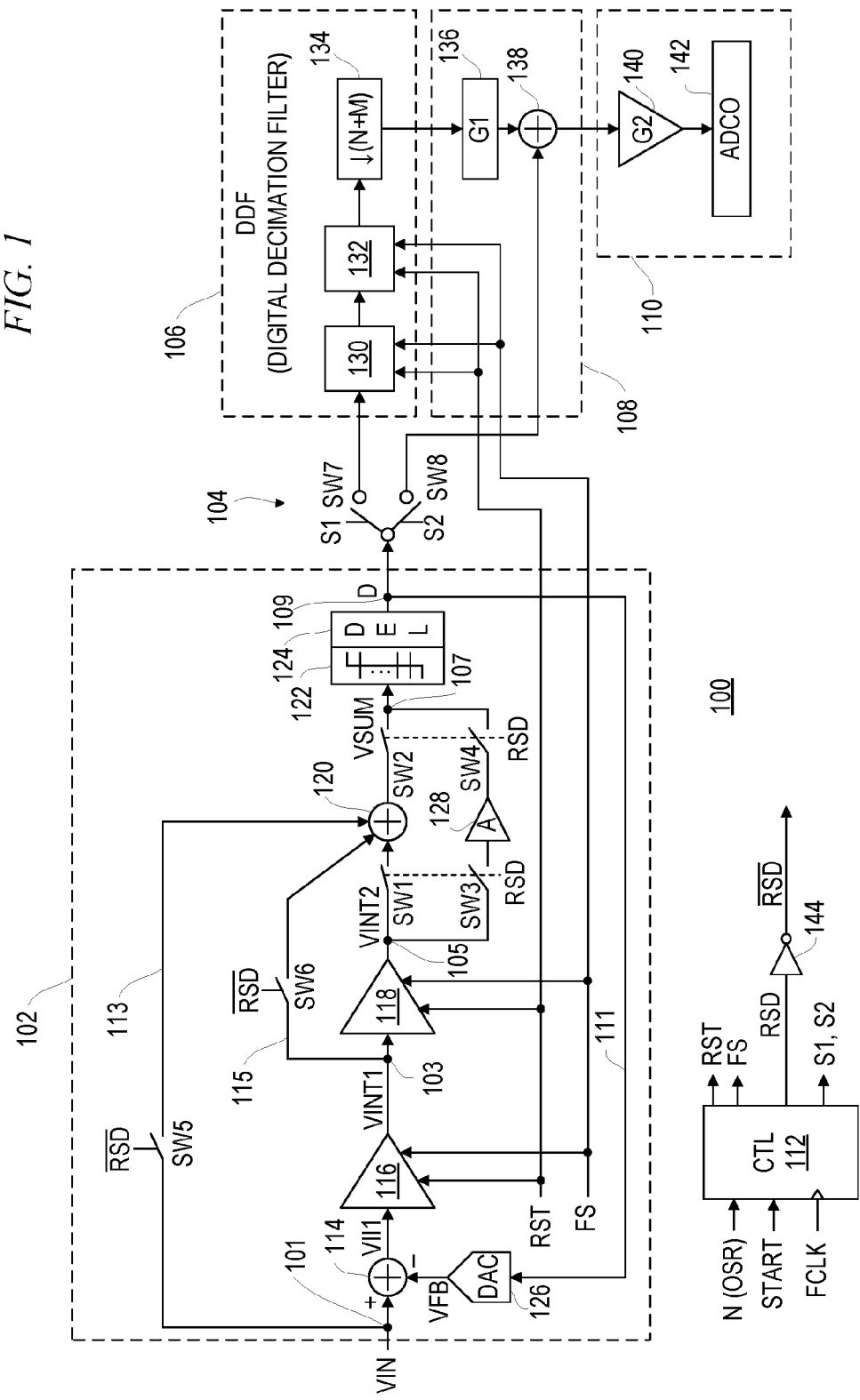
FIG. 1 is a simplified block diagram of an incremental analog to digital converter (IADC) implemented according to one embodiment of the present invention.

FIG. 1 is a simplified block diagram of an incremental analog to digital converter (IADC) 100 implemented according to one embodiment of the present invention. In the illustrated embodiment, the IADC 100 includes a delta-sigma (ΔΣ) modulator 102, an electronic switch 104, a digital decimation filter (DDF) 106, a digital combiner 108, an output circuit 110, and a controller (CTL) 112. In the illustrated embodiment, the ΔΣ modulator 102 includes a first analog adder 114, a first integrator 116, a second integrator 118, a second analog adder 120, a quantizer 122, a delay block 124 (DEL, having Z-transform transfer function $Z^{-1}$), a digital-to-analog converter (DAC) 126, an amplifier 128, and additional signal paths and electronic switches as further described herein. In the illustrated embodiment, the DDF 106 includes a first digital integrator 130, a second digital integrator 132, and a digital decimator 134. The digital combiner 108 may be implemented with digital multiplier 136 followed by a digital adder 138. The output circuit 110 includes a second digital multiplier 140 and an output register 142. The first digital multiplier 136 has a gain G1 and the second digital multiplier 140 has a gain G2. It is noted that digital multiplication may be achieved with one or more add and shift operations as understood by those of ordinary skill in the art.

The present invention is not limited to the particular configuration of the ΔΣ modulator 102 or the DDF 106. The order of the ΔΣ modulator 102 and the DDF 106 is an integer number "M" corresponding to the number of integrators coupled in series within each of the ΔΣ modulator 102 and the DDF 106, in which each have the same number of integrators. In the illustrated embodiment, the ΔΣ modulator 102 has two analog integrators and the DDF 106 has two digital integrators, and thus is a second order system (e.g., M=2), but may alternatively be a single-order system (e.g., M=1 for single integrator) or a third order modulator (e.g., M=3 for three integrators) or more. Thus, M is at least one and may be greater than 3 depending upon the speed of the integrators and conversion time specifications.

In the illustrated embodiment, an analog input voltage (VIN) is provided via an input node 101 to one input of the adder 114, which has another input receiving an analog feedback voltage (VFB) from an output of the DAC 126. The adder 114 subtracts VFB from VIN and provides a difference voltage VI1 (or VI1=VIN−VFB) to an input of the integrator 116. The integrator 116 has an output providing a first integrated voltage (VINT1) on a node 103, which is coupled to an input of the integrator 118. The integrator 118 has an output providing a second integrated voltage (VINT2) on a node 105, which is coupled through an electronic switch SW1 to one input of the adder 120. The output of the adder 120 is provided through another electronic switch SW2 to a node 136 developing a sum voltage (VSUM), which is provided to an input of the quantizer 122. The quantizer 122 provides a digital output sample D on an output node 109 through the delay block 124. A feedback path 111 is coupled between node 109 and an input of the DAC 126, in which the DAC 126 converts a received digital output sample D to the feedback voltage VFB provided to the negative or subtracting input of the adder 114.

The first and second integrators 116 and 118 have gain values of k1 and k2, respectively. The gain values k1 and k2 are configured for suitable loop gain and for adjusting the positive and negative voltage swing of VSUM for the full input voltage range of the quantizer 122. In one embodiment, the transfer function of the first integrator is $k1/(1-Z^{-1})$ and the transfer function of the second integrator is $k2*Z^{-1}/(1-Z^{-1})$, in which "Z" denotes the Z-transform denoting the complex frequency domain. The quantizer 122 may be configured to convert voltage into any number of bits. In one embodiment, the quantizer 122 is a 3-bit quantizer for providing $2^3=8$ different digital output values. The number of bits of the quantizer 122 may be different for adjusting the resolution (and accuracy) of the conversion.

Node 105 is also provided through another electronic switch SW3 to an input of the amplifier 128, having its output provided through another electronic switch SW4 to the node 136. The amplifier 128 has a suitable analog gain value "A". A first feed forward path 113 is coupled between the input node 101 and a second input of the adder 120 through an electronic switch SW5, and a second feed forward path 115 is coupled between node 103 at the output of the integrator 116 and a third input of the adder 120 through yet another electronic switch SW6. The switch SW5 inserts the feed forward path 113 when closed and removes the feed forward path 113 when open. Likewise, the switch SW6 inserts the feed forward path 115 when closed and removes the feed forward path 115 when open. When the switches SW1, SW2, SW5 and SW6 are all closed, the adder 120 develops VSUM as VSUM=VIN+VINT1+VIN2.

In the illustrated configuration, the electronic switch 104 is implemented as two separate switches SW7 and SW8, each having a first terminal coupled to the output node 109. The second terminal of the first switch SW7 is coupled to the input of the DDF 106, and the second terminal of the second switch SW8 is coupled to an input of the digital combiner 108. In the illustrated embodiment, the second terminal of the second switch SW8 is coupled to an input of the digital adder 138 of the digital combiner 108.

Each of the electronic switches SW1, SW2, SW3, SW4, SW5, SW6, SW7, and SW8 (SW1-SW8) are shown as single-pole, single-throw (SPST) switches in which each switch may be implemented using one or more transistors, such as field-effect transistors (FETs), or MOS transistors or the like (not shown). The switches SW1-SW4 are controlled by a residue signal RSD. When RSD is low, switches SW1 and SW2 are closed while SW3 and SW4 are open as shown, so that VINT2 is provided to an input of the adder 120 and the output of the adder 120 is provided to the input of the quantizer 122. Thus, when RSD is low, the adder 120 is inserted into the circuit while the amplifier 128 is removed from the circuit. When RSD is high, switches SW1 and SW2 are opened while SW3 and SW4 are closed, so that VINT2 is provided to an input of the amplifier 128 and the output of the amplifier 128 is provided to the input of the quantizer 122. Thus, when RSD is high, the adder 120 is removed from the circuit and replaced by the amplifier 128.

The switches SW5 and SW6 are controlled by an inverted version of RSD, or $\overline{RSD}$, which may be developed at the output of an inverter 144 receiving RSD at its input. SW5 and SW6 are each open when $\overline{RSD}$ is low and SW5 and SW6 are each closed when $\overline{RSD}$ is high. In this manner, VIN is provided through feed forward path 113 to an input of the adder 120 when $\overline{RSD}$ is high closing switch SW5, but the feed forward path 113 is removed from the circuit so that the corresponding input of the adder 120 is essentially zero when $\overline{RSD}$ is low opening switch SW5. Likewise, VINT1 is provided through feed forward path 115 to another input of the adder 120 when $\overline{RSD}$ is high closing switch SW6, but the feed forward path 115 is removed from the circuit so that the corresponding input of the adder 120 is zero when $\overline{RSD}$ is low opening switch SW6.

The switch SW7 is controlled by a first control signal S1, and the switch SW8 is controlled by a second control signal S2. In one embodiment, the switches SW7 and SW8 are each opened when its corresponding control signal is low, and is closed when its control signal is high. Generally, S1 is asserted high to close SW7 to couple the output of the ΔΣ modulator 102 to the input of the DDF 106, and S2 is asserted high to close SW8 to couple the output of the ΔΣ modulator 102 to the input of the digital combiner 108.

The output of the first digital integrator 130 is provided to an input of the second digital integrator 132, having its output provided to an input of the digital decimator 134. The output of the digital decimator 134 is provided to an input of the digital combiner 108 (e.g., to an input of the digital multiplier 136). In one embodiment, the transfer function of each of the digital integrators is $Z^{-1}/(1-Z^{-1})$. The first and second digital integrators 130 and 132 may each be configured as a digital accumulator, which may include a register (not shown) and a two-input digital adder (not shown). In this particular configuration of the digital integrators, for example, the input of each digital integrator is provided to one input of its digital adder, having its other input receiving the digital value stored in its register, and having its output providing a sum value which is stored back into its register. Thus, the digital value provided at the input is "accumulated" or added to the value of the register in each cycle.

A reset signal RST is provided to respective reset inputs of the first and second integrators 116 and 118 and to respective reset inputs of the first and second digital integrators 130 and 132. When RST is asserted high, the output of each of the first and second integrators 116 and 118 and of each of the first and second digital integrators 130 and 132 is zero. A sample clock signal FS is provided to respect clock inputs of the first and second integrators 116 and 118, the quantizer 122 (or the delay block 124), and the first and second digital integrators 130 and 132. FS is generally a square-wave signal with the desired sampling frequency, in which the ΔΣ modulator 102 outputs a digital output sample D on node 109 after each rising edge of FS.

In the illustrated configuration, the controller 112 receives an oversampling rate (OSR) value in the form of an integer value N (e.g., N=OSR), a START value, and a clock signal FCLK. The controller 112 provides and/or controls the RST, FS, RSD, $\overline{RSD}$ (via RSD and inverter 144), S1, and S2 signals to control operation of the IADC 100 as further described herein. START is an ansynchronous trigger signal that is used to initiate each conversion cycle. In one embodiment, START may be pulsed or toggled to initiate one conversion cycle (e.g., asserted to start the conversion cycle and then negated during the conversion cycle). START may also remain asserted causing the IADC 100 to perform multiple successive conversion cycles while START remains asserted. The clock signal FCLK has any suitable frequency level depending upon the particular configuration, and generally has the same or higher frequency level as the sample clock signal FS (e.g., FCLK may be divided down by a clock divider or the like to develop FS).

Each conversion cycle has a duration of N+M cycles of FS. After the first N cycles, the second digital integrator 132 develops a digitally integrated or accumulated value of the data samples provided by the ΔΣ modulator 102. The additional M cycles are used to extract a residue value D_RES from the ΔΣ modulator 102. The digital decimator 134 decimates or divides the accumulated value by the total number of conversion cycles N+M to provide a preliminary output value MAINO. The digital combiner 108 generally operates to multiply the preliminary output value MAINO from the DDF 106 by the gain G1 and to add the result G1*MAINO to the residue value D_RES provided from the ΔΣ modulator 102 to provide an initial digital output value G1*MAINO+D_RES to the output circuit 110. The second digital multiplier 140 of the output circuit 110 multiplies the initial digital output value by the gain G2 to provide the final digital output value ADCO latched and stored in the register 142.

Figure 2:
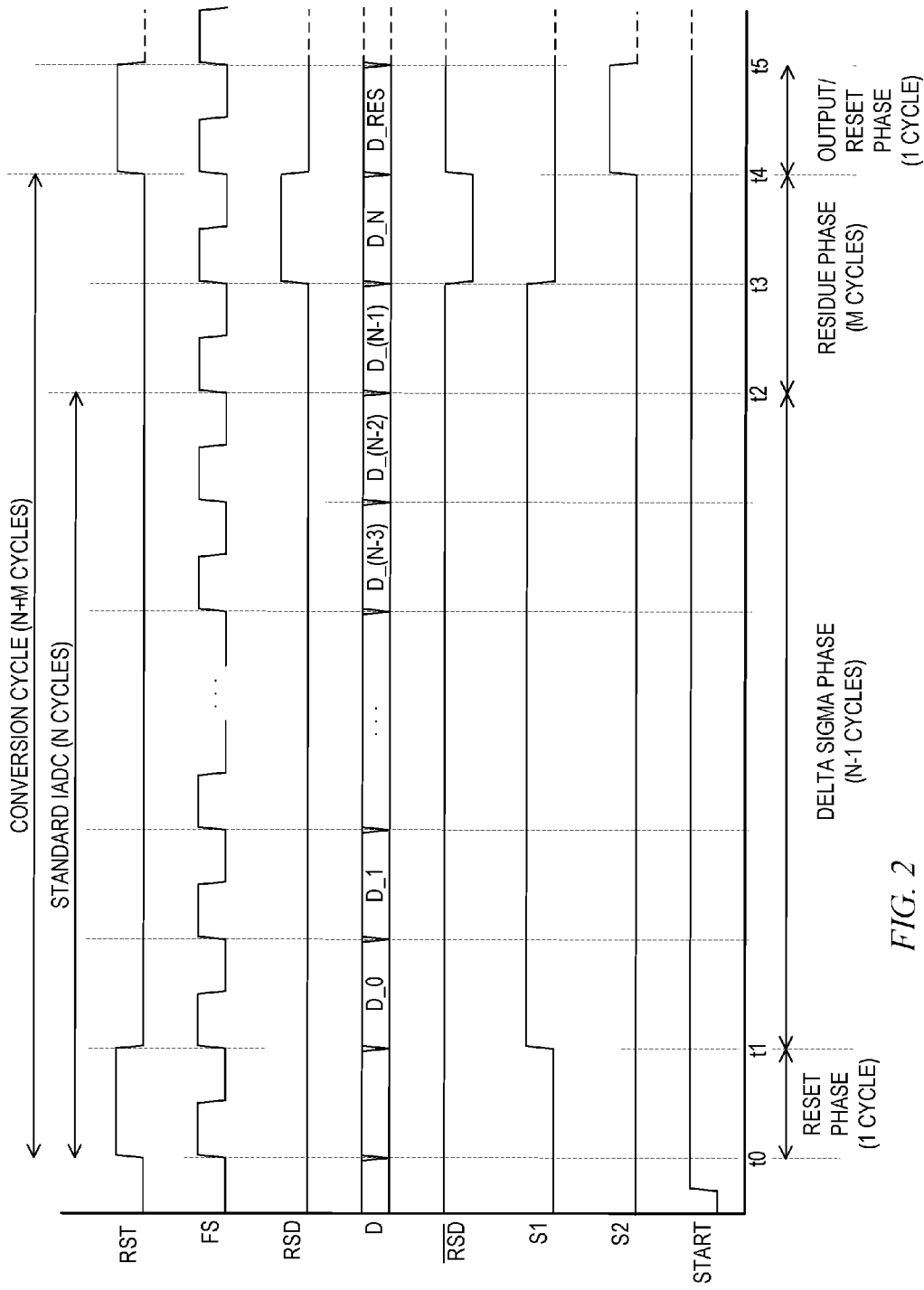
FIG. 2 is a timing diagram illustrating operation of the IADC of FIG. 1 according to one embodiment of the present invention for a first conversion cycle followed by the beginning of a second conversion cycle.

FIG. 2 is a timing diagram illustrating operation of the IADC 100 according to one embodiment of the present invention for a first conversion cycle followed by the beginning of a second conversion cycle. The RST, FS, RSD, D, $\overline{RSD}$, S1, S2, and START signals are plotted versus time in the timing diagram. In response to START, the controller 112 controls the IADC 100 to convert the analog input signal VIN into the final digital output value ADCO for the first conversion cycle or for each of two or more repetitive sequential conversion cycles. Each conversion cycle is divided into multiple phases, including a reset phase between times t0 and t1 having a duration of 1 FS cycle, a delta sigma phase between times t1 and t2 having a duration of N−1 FS cycles, and a residue phase between times t2 and t4 having a duration of "M" FS cycles (in which M is the same number as the order of the ΔΣ modulator 102 and DDF 106, e.g., M=2 in the illustrated embodiment). In this manner, each conversion cycle is N+M FS cycles in duration. A different order and corresponding number M of cycles for the residue phase may be implemented for different embodiments.

The residue value D_RES is developed during the conversion cycle but not output from the ΔΣ modulator 102 until the next FS cycle between times t4 and t5, referred to as an output phase having a duration of one FS cycle. During the output phase, MAINO is combined with D_RES to develop ADCO for the current conversion cycle. For back-to-back conversion cycles, the output phase of the current conversion cycle overlaps the reset phase of the next conversion cycle, shown as an output/reset phase. Thus, the RST signal may be simultaneoulsy asserted during the output phase of the current conversion cycle to begin the reset phase of the next conversion cycle.

START is asserted asynchronously to initiate a first conversion cycle, which begins upon the next cycle of FS. START may be negated during the conversion cycle if only one conversion cycle is desired, or may remain asserted for multiple conversion cycles. In response to assertion of START, the controller 112 controls the RST, RSD (and $\overline{RSD}$), S1, and S2 signals synchronous with FS cycles as shown to transition the IADC 100 through each of the reset, delta sigma, residue, and output phases for each conversion cycle. At about time t0, the RST signal is asserted high to initiate the reset phase at the beginning of the first conversion cycle. RSD remains low during the reset and delta sigma phases and is asserted high during the last FS cycle of the residue phase as further described below. Since RSD is low, $\overline{RSD}$ is initially high. S1 and S2 are initially low during the reset phase (although S2 may be asserted for each combined output/residue phase as further described herein).

FIG. 3 is a block diagram of the configuration of the IADC 100 during the reset phase (and ignoring the output phase). The RST signal asserted high resets both of the analog integrators 116 and 118 and both of the digital integrators 130 and 132 to zero. Since $\overline{RSD}$ is high, switch SW5 is closed to provide VIN to its corresponding input of the adder 120 via the feed forward path 113. Although the switch SW6 is also closed, since the outputs VINT1 and VINT2 of the integrators 116 and 118 are both zero, only VIN is passed via the feed forward path 113 and the adder 120 as VSUM on node 136 during the reset phase. During the reset phase, the adder 120 simply drives VSUM as VIN. Since S1 and S2 are both low (at least for the first conversion cycle), the output node 109 of the ΔΣ modulator 102 is not coupled to anything including the DDF 106. In the combined reset/output phase for the next and any subsequent conversion cycles, S2 is high closing the switch SW8 to output D_RES as further described below.

Referring back to FIG. 2, at about time t1 when FS next goes high, the RST signal is negated low and S1 is asserted high to initiate the delta sigma phase. FIG. 4 is a block diagram of the configuration of the IADC 100 during the delta sigma phase and during the first FS cycle of the residue phase. Since S1 is asserted high, the switch SW7 is closed coupling the output of the ΔΣ modulator 102 to the input of the DDF 106. The analog integrators 116 and 118 and the digital integrators 130 and 132 are released from reset to begin performing their integrating functions. For each cycle of FS during the delta sigma phase (and for the first FS cycle of the residue phase), each new D value at node 109 is fed back and digitized by the DAC 126 to update VFB, and the adder 114 subtracts VFB from VIN to update VII1. Also during each FS cycle, the last VII1 value is integrated by the first integrator 116 to update VINT1, and the last VINT1 value is integrated by the second integrator 118 to update VINT2. Further during each FS cycle, concurrent values of VIN, VINT1 and VINT2 are added together by the adder 120 to update VSUM, and each VSUM value is quantized by the quantizer 122 and output by the delay block 124 to update the D value provided on node 109. The first digital integrator 130 digitally accumulates each new D value provided on node 109, and the second digital integrator 132 digitally accumulates each new sum value provided at the output of the first digital integrator 130 to update the preliminary digital output value MAINO. The configuration does not change during the first cycle of the residue phase.

Referring back to FIG. 2, in the first FS cycle of the delta sigma phase, the ΔΣ modulator 102 outputs an initial data sample D_0 on node 109. The D_0 sample is a quantized version of the input voltage VIN, which is converted by the DAC 126 to the analog feedback value VFB. In this manner, during the first FS cycle of the delta sigma phase, the adder 114 outputs a difference between VIN and its quantized version (provided as VFB) so that VII1 at the output of the adder 114 represents a first quantization error during the delta signal phase. D_0 is also provided as the first D value provided to the DDF 106. FS continues to toggle while the RST, RSD, $\overline{RSD}$, S1 and S2 values remain unchanged to develop successive D values D_0, D_1, . . . D(N−2) during a total of N−1 cycles for the delta sigma phase. It is noted that N is the same number as the OSR value, which defines the total number of FS cycles including the reset phase for developing MAINO, but which does not include the residue phase used to refine or otherwise improve the accuracy of the final output value. During the first cycle of the residue phase, the D_(N−1) value is developed and processed through the ΔΣ modulator 102 and the DDF 106.

At about time t2, the residue phase begins and has a duration of M cycles of FS. In the first cycle of the residue phase, S1 remains high while RSD and S2 remain low and the next D value D_(N−1) is provided to the first digital integrator 130 of the DDF 106. At about time t3, which is 1 FS cycle after time t2, RSD is asserted high while S1 and $\overline{RSD}$ are both negated low. Since S2 is also low, the output of the ΔΣ modulator 102 is temporarily decoupled from both the DDF 106 and the digital combiner 108 so that the D_N value is not used.

FIG. 5 is a block diagram of the configuration of the ΔΣ modulator 102 during the last FS cycle of the residue phase. During the last cycle of the residue phase, the feed forward paths 113 and 115 are opened (removed) and the amplifier 128 replaces the adder 120. The gain A of the amplifier 128 amplifies the output of the integrator 118 by a sufficient level for quantization by the quantizer 122. The D_N value is not used, but FS continues to toggle so that the ΔΣ modulator 102 develops the residue value D_RES. At the end of the residue phase, an analog version of the residue value is developed at the VSUM output of the amplifier 128 and provided to an input of the quantizer 124, shown as $D\_RES_A$.

Figure 6:
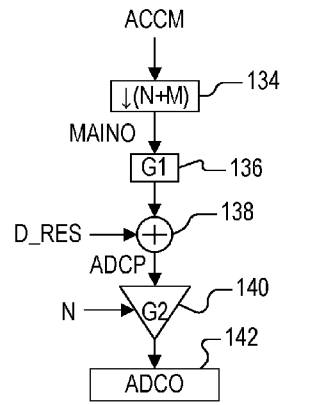
FIG. 6 is a block diagram of the configuration of an output portion of the IADC of FIG. 1 during the output phase.

FIG. 6 is a block diagram of the configuration of an output portion of the IADC 100 during the output phase. During the transition from the residue phase to the output phase at time t4, the analog version of the residue value $D\_RES_A$ is quantized and output as the final residue value D_RES to the input of the digital adder 138. The digital integrator 132 develops an accumulated value ACCM, which is decimated by the digital decimator 134 of the DDF 106 to provide the preliminary output value MAINO. MAINO is digitally multiplied by G1 (G1*MAINO) by the digital multiplier 136, and the result is provided to the other input of the digital adder 138. The digital adder 138 adds G1*MAINO to D_RES to provide an initial digital output value ADCP=G1*MAINO+D_RES. The initial digital output value ADCP is then digitally amplified by G2 by the digital multiplier 140 to develop the final digital output value ADCO=G2(G1*MAINO+D_RES) at the output of the digital multiplier 140. ADCO is provided to and stored in the register 142. It is noted that the gain G2 depends on the values of both N and M, although M is typically known, so that the digital multiplier 140 is shown receiving the value N to adjust G2.

Figure 7:
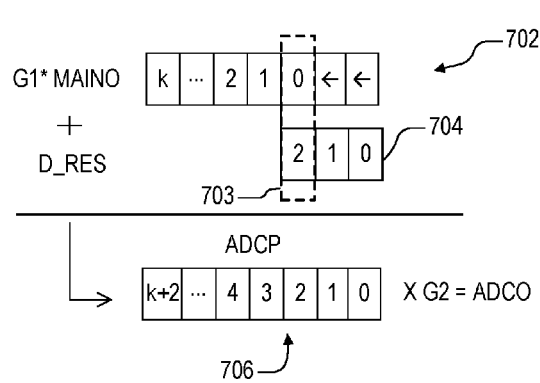
FIG. 7 is a figurative diagram of the operation of the IADC of FIG. 1 at the end of each conversion cycle according to one embodiment of the present invention for developing the final digital output value.

FIG. 7 is a figurative diagram of the operation of the IADC 100 at the end of each conversion cycle according to one embodiment of the present invention for developing the final digital output value ADCO for a 3-bit quantizer 122. In the illustrated embodiment, the value G1*MAINO is a multiplied value shown at 702 for G1=4, which is the digital equivalent of left-shifting MAINO by 2 bits (when the least-significant bit (LSB) of the MAINO is on the right). The residue value D_RES is shown at 704 having a resolution of 3 bits for the configuration in which the quantizer 122 quantizes analog values with 3-bit resolution. Since MAINO is left-shifted by two bits by the digital multiplier 136, alignment 703 illustrates that the LSB of the multiplied value shown at 702, or G1*MAINO, is aligned with the most-significant bit (MSB) of the D_RES residue value shown at 704 when added together by the digital adder 138, resulting in the initial digital output value ADCP shown at 706 at the output of the adder 138 having k+3 bits. Thus, the D_RES residue value increases the accuracy of the digital conversion value by 2 extra bits of resolution for a 3-bit quantizer 122. If the resolution of the quantizer 122 is different, then the gain G1 and the number of bits of D_RES is adjusted accordingly. For example, for a 4-bit quantizer 122, the gain G1 is 8 so that MAINO is left-shifted by three bits and added to the 4-bit D_RES value to increase the accuracy of the digital conversion value by 3 extra bits of resolution.

The initial digital output value ADCP shown at 706 at the output of the digital combiner 108 is then digitally multiplied by G2 by the digital multiplier 140 to obtain the final digital output value ADCO. The gain G2 is used to adjust the initial digital output value ADCP to provide the final digital output value ADCO having a digital full-scale of exactly $2^P$, where "P" is an integer (e.g., the ADCO full-scale value is an exact power of 2). For embodiments in which OSR=N is an exact power of two (e.g., $N=2^a$ for integer "a") and for which the system order M=2, then G2=N/(N+1). If N is not an exact power of 2, then G2 still depends upon N (assuming known value of M) but with a different calculation. For embodiments in which OSR=N is an exact power of two and M=1 (single order system), then G2 may be simplified to G2=1.

In a specific embodiment for N=64, M=2, and for a 3-bit quantizer 122, then the first digital integrator 130 includes at least 9 bits (i.e., $2^3*N=8*64=2^9$), and the second digital integrator 132 includes 15 bits with a resolution of between 14 and 15 bits ($2^3*N*(N+1)/2=2^{14}*(N+1)N=2^{14}*65/64$). The 15-bit output of the second digital integrator 132 is then decimated by N+M so that MAINO is also represented as a 15-bit value (e.g., k=14). The digital multiplier 136 includes at least 17 bits and adds the 3-bit value D_RES to provide ADCP as a 17-bit value having a full-scale of $2^{16}*$ (65/64)=65,536+1,024 (66,560). The gain G2=N/(N+1)=64/ 65 adjusts ADCP to provide ADCO as a 16-bit value having a full-scale resolution of $2^{k+2}=2^{16}$. It is appreciated that these values are different for different values of N and M and for a different resolution of the quantizer 122 in different embodiments.

Figure 8:
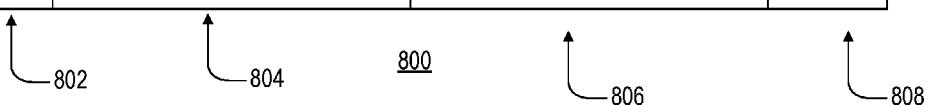
FIG. 8 is a tabular diagram of a time-domain analysis for the operation of the ΔΣ modulator of FIG. 1 during a conversion cycle according to one embodiment of the present invention.

FIG. 8 is a tabular diagram 800 of a time-domain analysis for the operation of the ΔΣ modulator 102 during a conversion cycle according to one embodiment of the present invention. The tabular diagram 800 has 4 columns, including a cycle number (CNUM) 802, a VINT/k1 column 804 indicating the output of the first integrator 116 divided by its gain k1, a VINT2 column 806 indicating the output of the second integrator 118 (including its gain k2), and a fourth column D(−1) 808 indicating the D value at the output of the quantizer 122 before the delay block 124. The first cycle number 0 is the reset cycle in which the output of both of the integrators 116 and 118 is zero. The initial data sample D_0 is at the output of the quantizer 122, but does not appear as the output of the ΔΣ modulator 102 on node 109 until the next cycle (CNUM=1) as shown in FIG. 2. In the next cycle number 1, the output of the first integrator 116 (divided by its gain k1) is the difference between VIN during cycle 1, or VIN[1], and the converted D value from the prior FS clock cycle, or D0. The number in the brackets "[ ]" denotes the cycle number. The notation Dx refers to the VFB output of the DAC 126 when D_x is provided at its input. For example, D0 in cycle 1 is the converted value of D_0 from cycle 0. The corresponding output VINT2 in column 706 for cycle 1 is zero.

In cycle 2, the output of the integrator 116 divided by its gain k1 is the sum of the VIN values at cycles 1 and 2 less the sum of the converted D values of cycles 0 and 1, or VIN[1]+VIN[2]−(D0+D1). The corresponding output of the second integrator 118 is the sum of its output in the first cycle, or VINT2[1]+its gain k2 times the output VINT1[1] of the first integrator 116 in the first cycle, or VINT2[1]+k2*VINT1[1], which equals k2*VINT[1] since VINT2[1] from the first cycle is zero. Operation proceeds in this manner from cycle to cycle to a last cycle N+1 in which the D_RES value is provided at the output of the quantizer 122.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An incremental analog to digital converter for digitizing an analog voltage, comprising:
  a delta sigma modulator having an input for receiving the analog voltage and having an output, wherein said delta sigma modulator comprises M analog integrators in which M is at least one;
  a digital decimation filter comprising M digital integrators, said digital decimation filter having an input selectively coupled to said output of said delta sigma modulator and having an output;
  a controller that operates said delta sigma modulator and said digital decimation filter for at least one conversion cycle, wherein said controller:
    resets said delta sigma modulator and said digital decimation filter during a reset stage;
    operates said delta sigma modulator and said digital decimation filter for a plurality of clock cycles during a delta sigma phase wherein said delta sigma modulator converts the analog voltage into a corresponding plurality of digital samples, and wherein said digital decimation filter converts said plurality of digital samples into a preliminary digital output value; and
    operates said delta sigma modulator during a residue phase for M clock cycles wherein said delta sigma modulator provides a digital residue value at said output of said delta sigma modulator; and
  a digital combiner that combines said preliminary digital output value with said digital residue value to provide an initial digital output value.

2. The incremental analog to digital converter of claim 1, wherein said digital combiner comprises a digital multiplier and a digital adder, wherein said digital multiplier multiplies said preliminary digital output value by a gain value to provide a multiplied value, and wherein said digital adder adds said digital residue value to said multiplied value to provide said initial digital output value.

3. The incremental analog to digital converter of claim 1, wherein said digital combiner left-shifts said preliminary digital output value to provide a shifted value and adds said digital residue value to said shifted value to provide said initial digital output value.

4. The incremental analog to digital converter of claim 1, wherein N is a total number of clock cycles of said reset stage and said delta sigma phase, further comprising a digital multiplier that multiplies said initial digital output value by a gain value based on N and M to provide a final digital output value having a full-scale value that is an exact power of 2.

5. The incremental analog to digital converter of claim 1, wherein said plurality of digital samples from said delta sigma modulator comprises N digital samples, and wherein said digital decimation filter comprises:
  at least one digital integrator that digitally integrates said N digital samples to develop an accumulated value; and
  a digital decimator that decimates said accumulated value by N+M to provide said preliminary digital output value.

6. The incremental analog to digital converter of claim 1, wherein said delta sigma modulator comprises a second order delta sigma modulator comprising two analog integrators and wherein said digital decimation filter comprises a second order filter comprising two digital integrators.

7. The incremental analog to digital converter of claim 1, wherein said delta sigma modulator comprises:
  a first adder having a first input for receiving the analog voltage, having a second input receiving a feedback voltage, and having an output;
  a first integrator having an input coupled to said output of said first adder and having an output;
  a second integrator having an input coupled to said output of said first integrator and having an output;
  a second adder having a first input selectively receiving the analog voltage, having a second input selectively coupled to said output of said first integrator, having a third input coupled to said output of said second integrator, and having an output;
  a quantizer having an input coupled to said output of said second adder and having an output providing said plurality of digital samples; and
  a digital to analog converter having an input coupled to said output of said quantizer and having an output coupled to said second input of said first analog comparator for providing said feedback voltage.

8. The incremental analog to digital converter of claim 7, wherein said controller resets said first and second integrators during said reset phase, and wherein said controller controls a plurality of electronic switches to couple the analog voltage and said outputs of both of said first and second integrators to said second adder during said reset phase, said delta sigma phase and a first clock cycle of said residue phase, and to decouple the analog voltage and said outputs of said first and second integrators from said second adder during a last clock cycle of said residue phase.

9. The incremental analog to digital converter of claim 8, wherein said controller controls said plurality of electronic switches to replace said second analog adder with an analog amplifier during said last clock cycle of said residue phase.

10. The incremental analog to digital converter of claim 9, wherein said controller controls said plurality of electronic switches to couple said output of said delta sigma modulator to said input of said digital decimation filter during said delta sigma phase and during said first clock cycle of said residue phase, and to couple said output of said delta sigma modulator to an input of said digital combiner during an output phase immediately following said residue phase.

11. The incremental analog to digital converter of claim 1, wherein N is a total number of clock cycles of said reset stage and said delta sigma phase, wherein M is a total number of clock cycles during said residue phase, and wherein said digital decimation filter comprises:
 a first digital integrator having an input and having an output, wherein said input of said first digital integrator is coupled to said output of said delta sigma modulator during said sigma delta phase and a first clock cycle of said residue phase;
 a second digital integrator having an input coupled to said output of said first digital integrator and having an output; and
 a decimator having an input coupled to said output of said second digital integrator and having an output providing said output of said digital decimation filter, wherein said decimator decimates an output of said second digital integrator by N+M to provide said preliminary digital output value.

12. The incremental analog to digital converter of claim 11, further comprising a digital multiplier that multiplies said initial digital output value by a gain value based on N and M to provide a final digital output value having a full-scale value based on a power of 2.

13. A method of digitizing an analog voltage, comprising:
 resetting integrators of an $M^{th}$ order delta sigma modulator and an $M^{th}$ order digital decimation filter during a reset phase, wherein M is at least one;
 operating the delta sigma modulator for a plurality of clock cycles during a delta sigma phase for converting the analog voltage into a corresponding plurality of digital samples at an output of the delta sigma modulator;
 operating the digital decimation filter for the plurality of clock cycles during the delta sigma phase for converting the plurality of digital samples into a preliminary digital output value;
 operating the delta sigma modulator during a residue phase for an additional M clock cycles for providing a digital residue value at the output of the delta sigma modulator; and
 digitally combining the preliminary digital output value with the digital residue value during an output phase to provide an initial digital output value.

14. The method of claim 13, wherein said digitally combining comprises:
 multiplying the preliminary digital output value by a gain value to provide a multiplied value; and
 adding the digital residue value to the multiplied value to provide the initial digital output value.

15. The method of claim 13, wherein said operating the delta sigma modulator for a plurality of clock cycles during the delta sigma phase comprises operating the delta sigma modulator for N clock cycles, further comprising multiplying the initial digital output value by a gain value based on N and M to provide a final digital output value having a full-scale value that is an exact power of 2.

16. The method of claim 13, wherein said converting the analog voltage into a corresponding plurality of digital samples comprises converting the analog voltage into N digital samples, and wherein said operating the digital decimation filter comprises:
 digitally integrating the N digital samples to provide an accumulated value; and
 decimating the accumulated value by N+M to provide the preliminary digital output value.

17. The method of claim 16, wherein said digitally integrating comprises digitally integrating the N digital samples to provide a plurality of first accumulated values and digitally integrating the plurality of first accumulated values to provide a second accumulated value.

18. The method of claim 13, wherein, for each clock cycle, said operating the delta sigma modulator for the plurality of clock cycles during the delta sigma phase and for a first clock cycle of the residue phase, comprises:
 subtracting a feedback voltage from the analog voltage to provide a difference value;
 integrating the difference value to provide a first integrated value;
 integrating the first integrated value to provide a second integrated value;
 adding together the analog voltage, the first integrated value, and the second integrated value to provide a sum value;
 quantizing the sum value to provide a corresponding one of the plurality of digital samples; and
 converting the corresponding one of the plurality of digital samples into the feedback voltage.

19. The method of claim 18, wherein, for a last clock cycle of said residue phase, said operating the delta sigma modulator comprises:
 integrating the difference value to provide the first integrated value;
 integrating the first integrated value to provide the second integrated value;
 amplifying the second integrated value to provide an amplified value; and
 quantizing the amplified value to provide the digital residue value.

20. The method of claim 19, wherein said operating the delta sigma modulator for a plurality of clock cycles during the delta sigma phase comprises operating the delta sigma modulator for N clock cycles, further comprising:
 said digitally combining comprising:
  shifting the preliminary digital output value to provide a multiplied value; and
  adding the digital residue value to the multiplied value to provide the initial digital output value; and
 multiplying the initial digital output value by a gain value based on N and M to provide a final digital output value having a full-scale value based on a power of 2.

\* \* \* \* \*